United States Patent
Zeng et al.

(10) Patent No.: US 11,257,851 B2
(45) Date of Patent: Feb. 22, 2022

(54) ARRAY SUBSTRATE AND MANUFACTURING METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Chao Zeng, Beijing (CN); Weiyun Huang, Beijing (CN); Yao Huang, Beijing (CN); Youngyik Ko, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 144 days.

(21) Appl. No.: 16/651,411

(22) PCT Filed: Sep. 27, 2019

(86) PCT No.: PCT/CN2019/108660
§ 371 (c)(1),
(2) Date: Mar. 27, 2020

(87) PCT Pub. No.: WO2020/114053
PCT Pub. Date: Jun. 11, 2020

(65) Prior Publication Data
US 2021/0111191 A1     Apr. 15, 2021

(30) Foreign Application Priority Data
Dec. 6, 2018   (CN) .......................... 201811486997.0

(51) Int. Cl.
*H01L 27/12* (2006.01)
*H01L 27/32* (2006.01)

(52) U.S. Cl.
CPC ........ *H01L 27/124* (2013.01); *H01L 27/1218* (2013.01); *H01L 27/1248* (2013.01);
(Continued)

(58) Field of Classification Search
CPC ............... H01L 27/124; H01L 27/1218; H01L 27/1248; H01L 27/1262; H01L 27/1259;
(Continued)

(56) References Cited

U.S. PATENT DOCUMENTS

| 7,158,195 B2 * | 1/2007 | Chang ............... G02F 1/136204 349/40 |
| 10,186,464 B2 * | 1/2019 | Wu ........................ G02F 1/1362 |

(Continued)

FOREIGN PATENT DOCUMENTS

| CN | 105652544 A | 6/2016 |
| CN | 107065332 A | 8/2017 |

(Continued)

OTHER PUBLICATIONS

First Office Action, including Search Report, for Chinese Patent Application No. 201811486997.0, dated Mar. 30, 2020, 21 pages.
(Continued)

*Primary Examiner* — Mohsen Ahmadi
(74) *Attorney, Agent, or Firm* — Westman, Champlin & Koehler, P.A.; Judson K. Champlin

(57) ABSTRACT

An array substrate includes: a base substrate; and a display region in which a signal line is provided and a fanout region provided on the base substrate, the fanout region including a first fanout line layer in which a first fanout line is provided, a second fanout line layer in which a second fanout line is provided, and one or more spacer layers
(Continued)

between the first fanout line layer and the second fanout line layer; the signal line is connected to the first fanout line or the second fanout line; and the spacer layers are made of an insulating material; wherein an orthographic projection of the first fanout line on the base substrate and an orthographic projection of the second fanout line on the base substrate are at least partially overlapped with each other. A method of manufacturing an array substrate and a display device are also provided.

17 Claims, 5 Drawing Sheets

(52) U.S. Cl.
CPC ...... *H01L 27/1259* (2013.01); *H01L 27/1262* (2013.01); *H01L 27/32* (2013.01)

(58) Field of Classification Search
CPC ..... H01L 27/32; G02F 1/1333; G02F 1/1345; G06F 3/047; G09G 3/3275
See application file for complete search history.

(56) References Cited

U.S. PATENT DOCUMENTS

| | | | | |
|---|---|---|---|---|
| 10,204,932 | B2* | 2/2019 | Yang | G03F 7/0005 |
| 10,373,986 | B2 | 8/2019 | Lai et al. | |
| 10,416,797 | B2* | 9/2019 | Ma | G06F 3/0412 |
| 10,445,579 | B2* | 10/2019 | Kimura | G06K 9/00671 |
| 10,453,834 | B2* | 10/2019 | Lee | G02F 1/136204 |
| 10,514,814 | B2 | 12/2019 | Fu et al. | |
| 10,578,938 | B2* | 3/2020 | Ji | G02F 1/136286 |
| 11,004,870 | B2* | 5/2021 | Lee | G02F 1/136209 |
| 2015/0015800 | A1* | 1/2015 | Yang | G06F 3/04164 |
| | | | | 349/12 |
| 2015/0379923 | A1* | 12/2015 | Lee | H01L 27/3272 |
| | | | | 345/206 |
| 2016/0026045 | A1* | 1/2016 | Inamura | G02F 1/136204 |
| | | | | 349/12 |
| 2016/0163780 | A1* | 6/2016 | Park | H01L 27/1222 |
| | | | | 257/40 |
| 2016/0343980 | A1 | 11/2016 | Lee et al. | |
| 2018/0166467 | A1* | 6/2018 | Lai | H01L 27/124 |
| 2019/0018526 | A1 | 1/2019 | Fu et al. | |

FOREIGN PATENT DOCUMENTS

| | | |
|---|---|---|
| CN | 107331294 A | 11/2017 |
| CN | 107561799 A | 1/2018 |
| CN | 107884994 A | 4/2018 |
| CN | 108363254 A | 8/2018 |
| CN | 108628020 A | 10/2018 |
| CN | 108732837 A | 11/2018 |
| CN | 108878444 A | 11/2018 |
| CN | 108878484 A | 11/2018 |
| CN | 109449169 A | 3/2019 |

OTHER PUBLICATIONS

Second Office Action, including search, for Chinese Patent Application No. 201811486997.0, dated Oct. 22, 2020, 21 pages.

* cited by examiner

ARRAY SUBSTRATE AND MANUFACTURING METHOD THEREOF, AND DISPLAY DEVICE

CROSS-REFERENCE TO RELATED APPLICATION

This application is a 371 National Stage Application of International Application No. PCT/CN2019/108660, filed om Sep. 27, 2019, entitled "ARRAY SUBSTRATE AND MANUFACTURING METHOD THEREOF, AND DISPLAY DEVICE", which has not yet published, and claims priority of Chinese Patent Application No. CN201811486997.0 filed on Dec. 6, 2018 with the China National Intellectual Property Administration, the contents of which are incorporated herein by reference in their entireties.

TECHNICAL FIELD

The present disclosure relates to the field of display technology, and more specifically, to an array substrate and its manufacturing method and a display device.

BACKGROUND

Currently, it is one of the tendencies of a display panel to narrow its lower frame and increase the screen-to-body ratio. In the existing design, after the bending process during the module (MDL) process, the main constituent component of the lower frame of the display panel is a fanout region, thus, reduction of width of the lower frame significantly contributes to increase of the screen-to-body ratio.

SUMMARY

An embodiment of the present application provides an array substrate, including: a base substrate; and a display region and a fanout region on the base substrate, wherein a signal line is provided in the display region; the fanout region includes a first fanout line layer in which a first fanout line is provided, a second fanout line layer in which a second fanout line is provided, and one or more spacer layers between the first fanout line layer and the second fanout line layer; the signal line is connected to the first fanout line or the second fanout line; and the spacer layers are made of an insulating material; wherein an orthographic projection of the first fanout line on the base substrate and an orthographic projection of the second fanout line on the base substrate are at least partially overlapped with each other.

In some embodiments, the signal line includes a first signal line connected to the first fanout line and a second signal line connected to the second fanout line.

In some embodiments, the array substrate includes a light shielding layer which is configured to shield incident light into the array substrate from the base substrate, and the second fanout line layer and the light shielding layer of the array substrate are made of same material and are in one same layer.

In some embodiments, the array substrate includes at least one gate line layers, and the first fanout line layer and one of the at least one gate line layers are made of same material and are in one same layer.

In some embodiments, the signal line includes a data line; the array substrate further includes a data line layer in which the data line is provided and a transition line layer between the data line layer and the first fanout line layer or between the data line layer and the second fanout line layer; the transition line layer includes a transition line; and the data line is electrically connected to the transition line and the transition line is electrically connected to the first fanout line or the second fanout line.

In some embodiments, the signal line further includes a gate line, and the transition line layer and the gate line are made of same material and are in one same layer.

In some embodiments, the array substrate includes a first gate line layer and a second gate line layer; the transition line layer and the first gate line layer are made of same material and are in one same layer; the fanout region includes at least one buffer layer and a first gate insulating layer between the transition line layer and the second fanout line layer, and a second gate insulating layer and at least one interlayer dielectric layer between the data line layer and the transition line layer; the data line is electrically connected to the transition line through a first conductive plug which penetrates the second gate insulating layer and the at least one interlayer dielectric layer; and the transition line is electrically connected to the second fanout line through a second conductive plug which penetrates the at least one buffer layer and the first gate insulating layer.

In some embodiments, the array substrate includes a first gate line layer and a second gate line layer; the transition line layer and the second gate line layer are made of same material and are in one same layer; the fanout region includes at least one buffer layer, a first gate insulating layer, and a second gate insulating layer between the transition line layer and the second fanout line layer, and at least one interlayer dielectric layer between the data line layer and the transition line layer; the data line is electrically connected to the transition line through a third conductive plug which penetrates the at least one interlayer dielectric layer; and the transition line is electrically connected to the second fanout line through a fourth conductive plug which penetrates the at least one buffer layer, the first gate insulating layer and the second gate insulating layer.

In some embodiments, the signal line includes a data line; the array substrate further includes a data line layer in which the data line is provided; the data line is electrically connected to the first fanout line or the second fanout line through a fifth conductive plug which penetrates one or more insulating layers between the data line layer and the first fanout line or between the data line layer and the second fanout line layer.

In some embodiments, the orthographic projection of the first fanout line on the base substrate and the orthographic projection of the second fanout line on the base substrate are fully overlapped with each other.

In some embodiments, the spacer layers include a buffer layer, or at least one gate insulating layer, or a combination of the buffer layer and the at least one gate insulating layer.

In some embodiments, a total thickness of the one or more spacer layers is greater than 500 nm.

In some embodiments, the first fanout line layer includes a plurality of the first fanout lines, and the second fanout line layer includes a plurality of the second fanout lines; and each of a pitch of the plurality of first fanout lines and a pitch of the plurality of second fanout lines is between 1.5 μm and 3.0 μm.

In some embodiments, a capacitance per unit area between the first fanout line and the second fanout line which are at least partially overlapped with each other is less than $8\times10^{-5}$ picofarad per square micrometer.

An embodiment of the present disclosure also provides a display device including the array substrate as described in any one of the above embodiments.

An embodiment of the present disclosure also provides a method of manufacturing an array substrate, including: forming a second fanout line layer including a second fanout line on a base substrate; forming one or more spacer layers on a side of the second fanout line layer distal to the base substrate; forming a first fanout line layer including a first fanout line on a side of the spacer layers distal to the base substrate, an orthographic projection of the first fanout line on the base substrate and an orthographic projection of the second fanout line on the base substrate being at least partially overlapped with each other; forming a signal line layer including a signal line on a side of the first fanout line layer distal to the base substrate, the signal line being connected to the first fanout line or the second fanout line; wherein, the spacer layers are made of an insulating material; the signal line is formed in a display region of the array substrate; and the first fanout line and the second fanout line are formed in a fanout region of the array substrate.

In some embodiments, the step of forming the second fanout line layer including the second fanout line on the base substrate further includes: forming a first metal thin film on the base substrate; and patterning the first metal thin film to form a light shielding layer and the second fanout line layer, the light shielding layer shielding incident light into the array substrate from the base substrate.

In some embodiments, the signal line includes a gate line, and after the step of forming one or more spacer layers on the side of the second fanout line layer distal to the base substrate, the method further includes: forming a second metal thin film on the spacer layers; patterning the second metal thin film to form a gate line layer in the display region and form a transition line layer at a boundary between the display region and the fanout region.

In some embodiments, the orthographic projection of the first fanout line on the base substrate and the orthographic projection of the second fanout line on the base substrate are fully overlapped with each other.

In some embodiments, the spacer layers include: a buffer layer, or at least one gate insulating layer, or a combination of the buffer layer and the at least one gate insulating layer.

BRIEF DESCRIPTION OF THE DRAWINGS

In order to further clarify the technical solutions of the embodiments of the present disclosure, the drawings of the embodiments will be briefly described below. Obviously, the drawings described below only relate to some embodiments of the present disclosure instead of limiting the present disclosure.

DETAILED DESCRIPTION OF EMBODIMENTS

In order to make the purpose, technical solutions and advantages of the embodiments of the present disclosure clearer, the technical solution of the embodiments of the present disclosure will be described clearly and completely below in conjunction with the accompanying drawings of the embodiments of the present disclosure. It is obvious that the described embodiments are a part of the embodiments of the present disclosure rather than all the embodiments of the present disclosure. Based on the described embodiments of the present disclosure, those skilled in the art can obtain other embodiments, without any inventive efforts, which should fall within the scope of the present disclosure.

Unless otherwise defined, technical terms or scientific terms used in the present disclosure are intended to be understood as having the ordinary meaning for those skilled in the art. The words "first", "second" and the like used in the present disclosure are not intended to define order, number, or priority, but to distinguish different components. Similarly, "a/an", "one", or "the" and the like do not indicate a limit on quantity, but rather indicates that there is at least one. The word "comprising" or "including" and the like mean that the element or item before the word is intended to encompass the element, the item and the like recited after the word, and not exclude other element or item. The word "connect" or "couple" and the like are not limited to physical or mechanical connections, but may include electrical connections, including direct or indirect connections. The words "upper", "lower", "left", "right", and the like are only used to indicate relative positional relationship. When the position of the described object changes, the relative positional relationship may also change accordingly.

An embodiment of the present disclosure provides an array substrate, which can reduce the width of the frame of the display panel to a certain extent.

Figure 1:
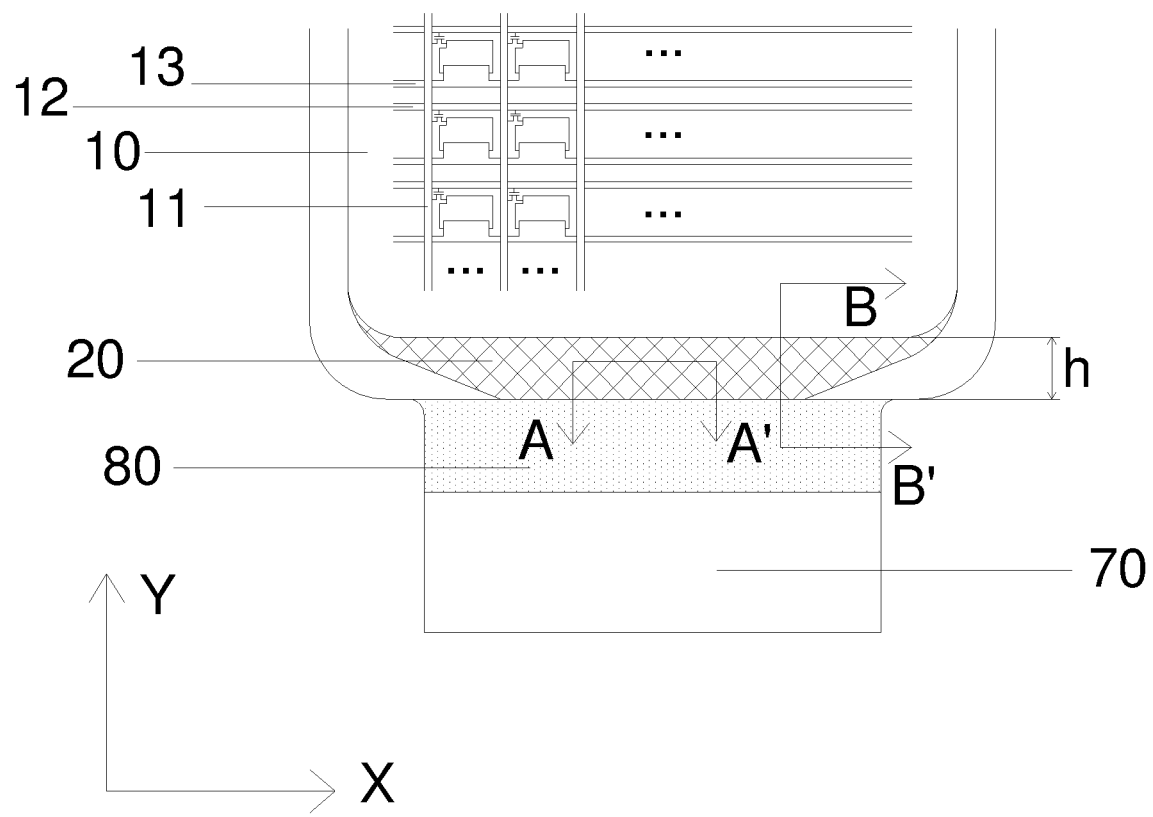
FIG. 1 schematically illustrates an array substrate according to some embodiments of the present disclosure.

FIG. 1 schematically illustrates an array substrate. The array substrate includes a display region 10 and a fanout region 20. There are signal lines formed in the display region. The signal lines include a data line 11, a first gate line 12, and a second gate line 13. The data line 11 is used to input the driving signal. The first gate line 12 is for example connected to the gate electrode of the thin film transistor (TFT) to provide a scanning signal. The second gate line 13 is used to, for example, form a storage capacitor. The signal transmission between the signal lines in the display region 10 and the external integrated circuit (IC) can be realized for example through the fanout lines in the fanout region 20.

The external integrated circuit is usually implemented by a separate circuit board 70, and there is a bending region 80 between the circuit board 70 and the fanout region 20. The bending of the bending region 80 allows the circuit board 70 to be folded back under the display region and the fanout region of the display panel, so that the circuit board 70 does not contribute to the frame width.

Figure 2:
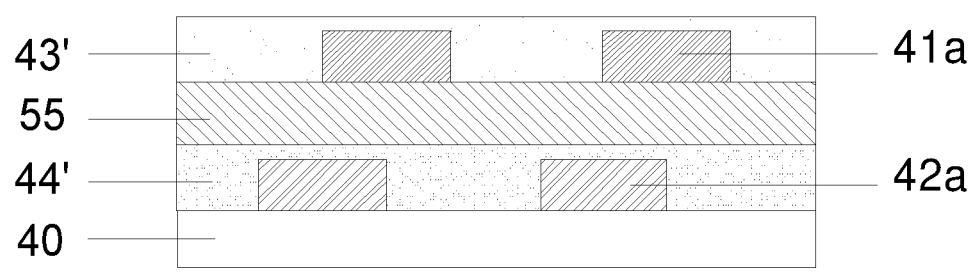
FIG. 2 schematically illustrates the cross-sectional view of a fanout region of an array substrate taken along the line AA' in FIG. 1 according to some embodiments of the present disclosure.

FIG. 2 is a cross-sectional view of the fanout region 20 taken along the line AA' in FIG. 1. As shown in FIG. 2, the fanout region is provided with a first fanout line 41a and a second fanout line 42a. The signal line may be connected to the first fanout line 41a, or the signal line may also be connected to the second fanout line 42a, so that the signal line can realize signal transmission to the external integrated circuit through the fanout line. In some embodiments, the signal line may include a first signal line connected to the first fanout line 41a and a second signal line connected to the second fanout line 42a. Between the first fanout line layer where the first fanout line 41a is located and the second fanout line layer where the second fanout line 42a is located, there may be provided with one or more spacer layers 55. The spacer layer 55 is made of an insulating material and may be used to form a relatively large interlayer space between the first fanout line layer and the second fanout line layer. The orthographic projection of the first fanout line 41a on a base substrate 40 and the orthographic projection of the second fanout line 42a on the base substrate 40 are at least partially overlapped with each other. The array substrate shown in FIG. 2 further includes a first insulating layer 43' and a second insulating layer 44'. The second insulating layer 44' may also be regarded as one of the spacer layers.

As can be seen from the above embodiments, in the array substrate provided by the present disclosure, the spacer layer is provided between the first fanout line layer and the second fanout line layer so as to increase the interval space therebetween. Thus, the capacitance formed between the first fanout line and the second fanout line further are reduced. Therefore, the problem of crosstalk is decreased and the power consumption is lowered. Meanwhile, the reduction in the capacitance formed between the first fanout line and the second fanout line also allows a certain overlap between the first fanout line and the second fanout line, thereby reducing the pitch of lines and decreasing the length of the fanout region in the Y direction which helps to narrow the frame.

Figure 3:
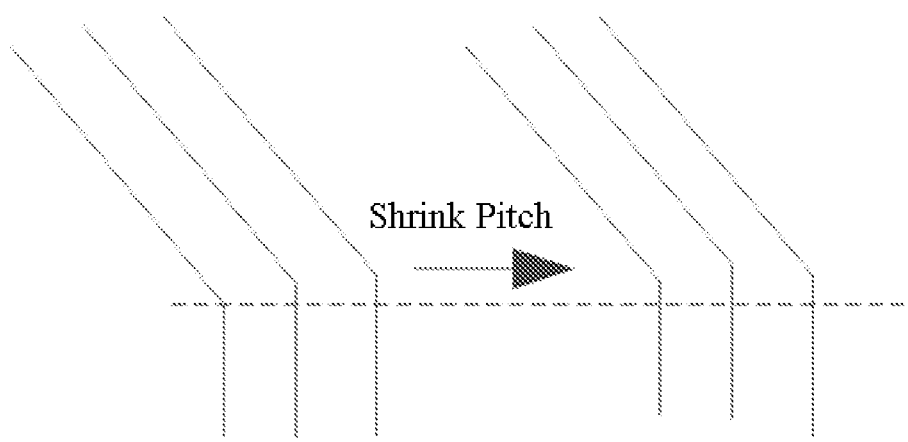
FIG. 3 schematically illustrates the principle of shrinking pitch of traces to narrow the lower frame in the Y direction.

The relationship between the reduction of the lines pitch and the realization of the narrow frame will be described briefly with reference to FIGS. 1 and 3. As shown in FIG. 3, the fanout line in the fanout region usually has an inclined section and a vertical section. When the pitch of the fanout line is reduced, the fanout lines will be compressed to the middle, and the inclined sections of the fanout lines will be compressed in both X and Y directions (refer to FIG. 1). In this way, the length of the fanout lines in the Y direction is reduced, so that the width of the lower frame of the array substrate could be reduced.

Figure 4:
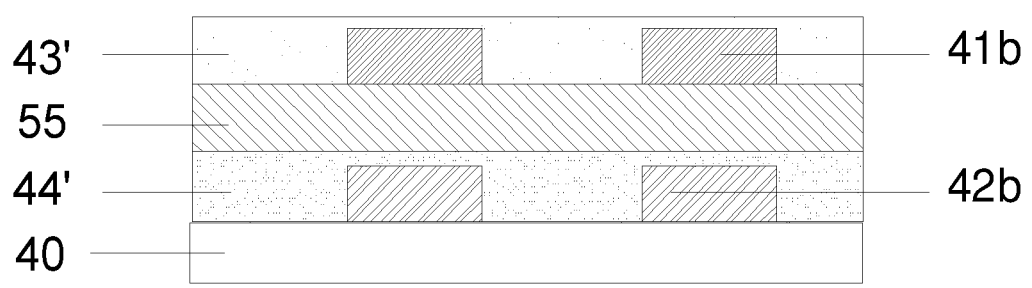
FIG. 4 schematically illustrates the cross-sectional view of a fanout region of an array substrate taken along the line AA' in FIG. 1 according to some other embodiments of the present disclosure.

As some embodiments of the present disclosure, as shown in FIG. 4, the orthographic projection of the first fanout line 41b on the base substrate 40 and the orthographic projection of the corresponding second fanout line 42b on the base substrate 40 are overlapped with each other. The capacitance formed between the first fanout line and the second fanout line is reduced by increasing the interlayer space between layers. Thus, the crosstalk problem is reduced, so that the first fanout line and the second fanout line can be overlapped completely, which could further reduce the pitch of lines and thus reduce the width of the lower frame. Through overlapping the fanout lines, for example, the pitch of lines can be reduced by about 17% compared to the existing design, and the length of the fanout region in the Y direction can be reduced by about 20% compared to the existing design.

Figure 5A:
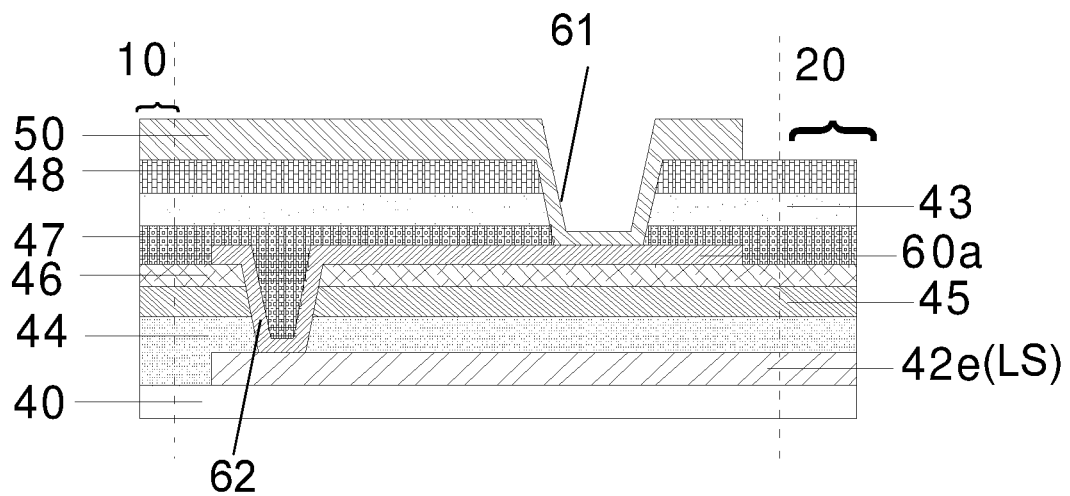
FIG. 5A schematically illustrates the cross-sectional view of a fanout region of an array substrate taken along the line BB' in FIG. 1 according to some other embodiments of the present disclosure.
Figure 5B:
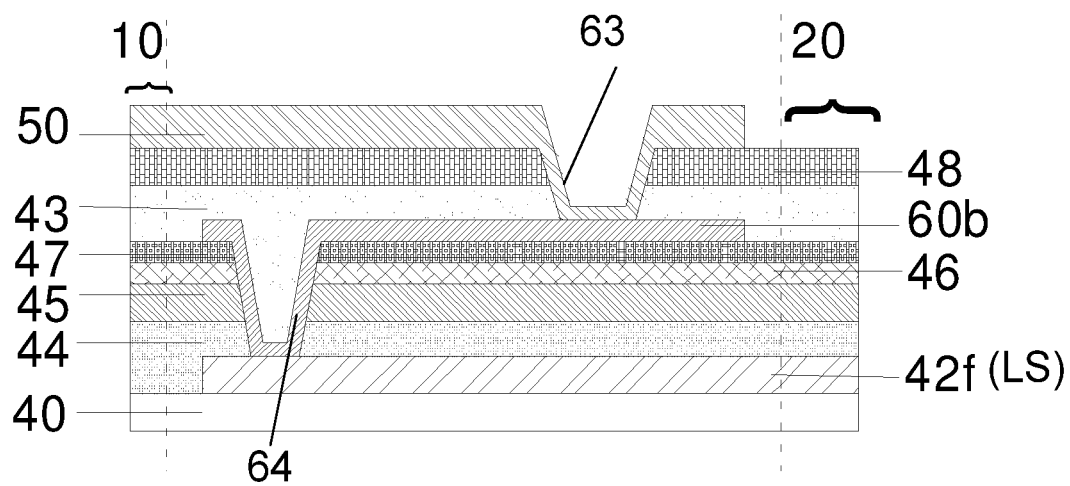
FIG. 5B schematically illustrates the cross-sectional view of a fanout region of an array substrate taken along the line BB' in FIG. 1 according to still other embodiments of the present disclosure.
Figure 5C:
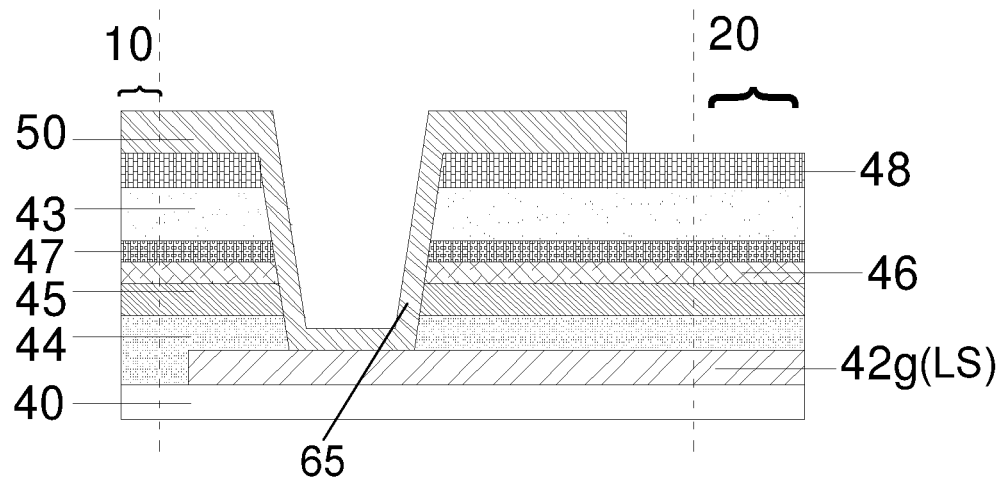
FIG. 5C schematically illustrates the cross-sectional view of a fanout region of an array substrate taken along the line BB' in FIG. 1 according to yet other embodiments of the present disclosure.

As some embodiments of the present disclosure, referring to FIG. 5A, FIG. 5B, and FIG. 5C, the spacer layer 55 may include a buffer layer. When the base substrate 40 is made of glass, a buffer layer is usually provided thereon. The buffer layer can prevent the impurities in the substrate from entering other layers. The material of the buffer layer is usually an insulating material, such as $SiN_X$ or $SiO_X$, although it is not limited thereto. The buffer layer is usually located near the base substrate 40. Therefore, when the second fanout line 42e/42f/42g is located below the buffer layer and the first fanout line 41e/41f (refer to FIGS. 6A and 6B) is located above the buffer layer, the interlayer space between the first fanout line and the second fanout line can be ensured to be large enough so that the capacitance between them can be reduced.

As an embodiment of the present disclosure, referring to FIG. 5A, 5B, or 5C, a layer of light shielding material is usually provided on the base substrate 40 to form a light shielding layer. The light shielding layer LS is used to shield the incident light through the back of the array substrate (such as the incident light into the array substrate from the base substrate) so as to prevent the light from adversely affecting the array substrate. For example, light shielding layer LS may prevent the light from illuminating the active layer of the thin film transistor (TFT) array on the array substrate, thereby avoiding the photo-induced carriers from being generated by the active layer due to the light. It can be seen that the second fanout line layer 42e, 42f or 42g is also disposed on the base substrate 40. That is, the second fanout line layer 42e, 42f or 42g and the light shielding layer of the array substrate may be made of the same material and located in the same layer. In other words, the second fanout line layer 42e, 42f or 42g itself can be regarded as a part of the light shielding layer LS and also has a light shielding effect. The light shielding layer LS is usually disposed directly on the substrate such that it is the lowest layer structure. Therefore, when one of the fanout line layers and the light shielding layer LS are in the same layer, there is enough interlayer space between the one of the fanout line layers and the other one of the fanout line layers.

In some embodiments, when the light shielding layer is made of a metal material, the second fanout line 42e, 42f or 42g is formed by patterning the light shielding layer LS in the fanout region 20. Through fabricating one of the fanout line layers by the light shielding layer LS, on one hand, the interlayer space between the one of the fanout lines and the other one of the fanout lines can be increased to further reduce the crosstalk and on the other hand, the light shielding layer (made of metal material, usually Mo) in the fanout region is more fully utilized.

Figure 6A:
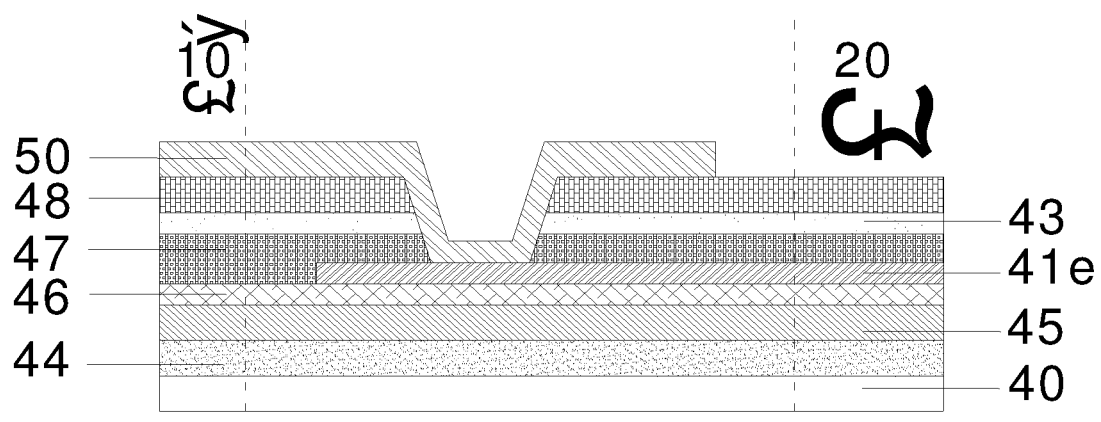
FIG. 6A schematically illustrates the cross-sectional view of a fanout region of an array substrate taken along the line BB' in FIG. 1 according to some other embodiments of the present disclosure.
Figure 6B:
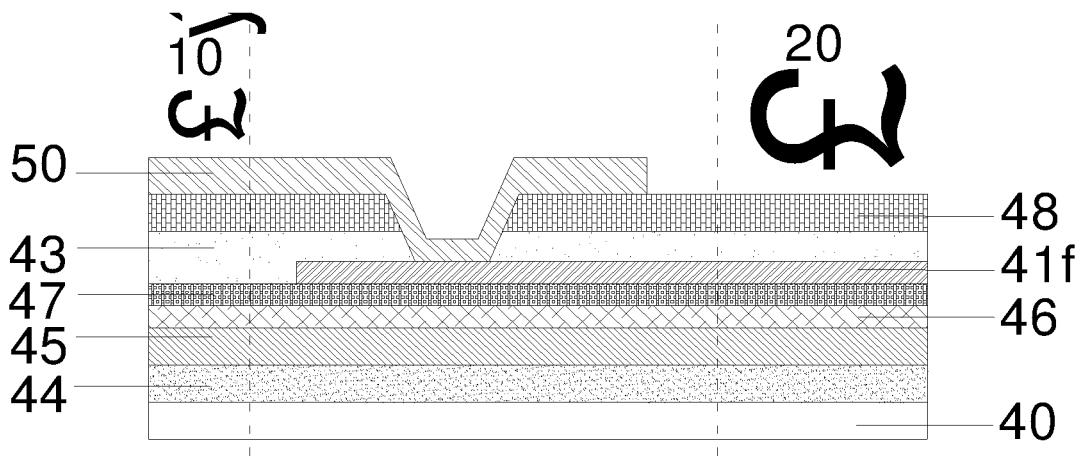
FIG. 6B schematically illustrates the cross-sectional view of a fanout region of an array substrate taken along the line BB' in FIG. 1 according to still other embodiments of the present disclosure.

As some embodiments of the present disclosure, as shown in FIG. 1, in the display region of the array substrate there is provided with a first gate line 12 for forming a gate electrode of a thin film transistor (TFT) and a second gate line 13 for forming a storage capacitor. While fabricating these two kinds of gate lines, the fanout lines can be formed in the fanout region by using the same patterning process in single step. As shown in FIG. 6A, the first gate line for forming a gate electrode of a TFT functions as the first fanout line 41*e* in the fanout region. The first fanout line 41*e* and the second fanout line 42*e*, 42*f* or 42*g* as shown in FIG. 5A, 5B or 5C form the fanout lines in the fanout region. As shown in FIG. 6B, the second gate line for forming the storage capacitor functions as the first fanout line 41*f* in the fanout region. The first fanout line 41*f* and the second fanout line 42*e*, 42*f* or 42*g* as shown in FIG. 5A, 5B or 5C form the fanout lines in the fanout region. It should be noted that, the first fanout line in the fanout region is formed by the gate line, since they can be fabricated at the same time by using single patterning process at the same layer, which, however, does not mean that the first fanout line and the gate line are electrically connected with each other. It is well known that the gate line and the fanout line are usually not electrically connected with each other in order to realize respective functions.

When the first gate line or the second gate line is formed as the first fanout line, it can be used with the aforementioned second fanout line formed by patterning the light shielding layer LS so as to form the two kinds of fanout lines in the fanout region. Between the first fanout line layer where the first fanout line is located and the second fanout line layer where the second fanout line is located, there is generally provided with a first buffer layer 44, a second buffer layer 45, a first gate insulating layer 46, and the like (as shown in FIG. 5B, a second gate insulating layer 47 may be included in some cases). These layers each may be part of the spacer layer. In this way, the thickness of layers, such as the buffer layer, the gate insulating layer, etc., may be used to reduce the capacitance between the first fanout line and the second fanout line, thereby avoiding signal crosstalk between the first fanout line and the second fanout line. If the capacitance between the first fanout line and the second fanout line needs to be further reduced, the thickness of the layers, such as the buffer layer and the gate insulating layer, etc., can also be appropriately increased.

In some embodiments, the total thickness of the one or more spacer layers may be greater than 500 nm. In some embodiments, the capacitance per unit area between the first fanout line and the second fanout line which are at least partially overlapped with each other is less than $8\times10^{-5}$ picofarads per square micrometer. The design including the total thickness of the above-mentioned spacer layer and the capacitance per unit area can effectively prevent signal crosstalk between the first fanout line and the second fanout line.

In some embodiments, the first fanout line layer includes a plurality of first fanout lines, and the second fanout line layer includes a plurality of second fanout lines. The pitch of the plurality of first fanout lines and the pitch of the plurality of second fanout lines may be between 1.5 μm and 3.0 μm. In general, the main function of the fanout region is to connect the data line 11 or the first gate line 12 of the circuit in the display region to an external integrated circuit. Therefore, the data line 11 or the first gate line 12 need to be connected to an external IC through the fanout line. In the embodiment of the present disclosure, when one of the fanout line layers is made by means of the light shielding layer LS, the data line and the fanout line may be directly connected with each other through a via hole.

In some embodiments, the array substrate may further include a transition line layer. The transition line layer is disposed between the data line layer where the data line is located and the first fanout line layer. Alternatively, the transition line layer may be disposed between the data line layer where the data line is located and the second fanout line layer. The transition line layer includes a transition line 60*a*/60*b*, as shown in FIGS. 5A and 5B. The data line is connected to the first fanout line or the second fanout line though the transition line. In this way, by providing the transition line layer, the depth of the via hole can be reduced and the reliability of the electrical connection can be improved. This method is particularly beneficial to the case where the interlayer space between the light shielding layer LS and the data line layer 50 where the data line is located is relatively large and the layers structure between the light shielding layer LS and the data line layer 50 is complicated.

According to some embodiments of the present disclosure, the gate line, which may be the first gate line 12 or the second gate line 13, is formed in the display region. The transition line layer and the gate line layer where the gate line is located are in the same layer. In this way, the transition line is formed at the same time by using the process of making the gate line, thereby saving process steps and improving production efficiency.

As shown in FIG. 5A, at the boundary between the display region 10 and the fanout region 20 (i.e., the region between the two vertical dashed lines in FIG. 5A), the transition line 60*a* and the first gate line which is used to form the gate electrode of the TFT may be made from the same material and disposed in the same layer, and the data line 50 is connected to the second fanout line 42*e* through the transition line 60*a*. As the gate is formed in the display region, the corresponding transition line 60*a* may be formed at the boundary between the display region 10 and the fanout region 20 to electrically connect the data line 50 with the second fanout line 42*e*. In some embodiments, the array substrate may include a first gate line layer where a first gate line is located and a second gate line layer where a second gate line is located. The transition line layer and the first gate line layer may be made from the same material and arranged in the same layer. The fanout region 20 includes: at least one buffer layer (for example, the first buffer layer 44 and/or the second buffer layer 45) and a first gate insulating layer 46 between the transition line layer where the transition line 60*a* is located and the second fanout line layer where the second fanout line 42*e* is located; and a second gate insulating layer 47 and at least one interlayer dielectric layer between the data line layer and the transition line layer. The data line 50 is electrically connected to the transition line 60*a* through a first conductive plug 61 which penetrates the second gate insulating layer 47 and at least one interlayer dielectric layer, and the transition line 60*a* is electrically connected to the second fanout line 42*e* through a second conductive plug 62 which penetrates the at least one buffer layer and the first gate insulating layer 46.

As shown in FIG. 5B, at the boundary between the display region 10 and the fanout region 20 (i.e., the region between the two vertical dashed lines in FIG. 5B), the transition line 60*b* and the second gate line which is used to form the storage capacitor may be made from the same material and disposed in the same layer. The transition line is used for electrically connecting the data line 50 with the second fanout line 42*f*. In some embodiments, the transition line layer 60*b* and the second gate line layer may be made from the same material and arranged in the same layer. The fanout region 20 may include: at least one buffer layer (for example, the first buffer layer 44 and/or the second buffer layer 45), a first gate insulating layer 46 and a second gate insulating layer 47 between the transition line layer where the transition line 60*b* is located and the second fanout line layer where the second fanout line 42*e* is located); and at least one interlayer dielectric layer between the data line layer and the transition line layer. The data line 50 is electrically connected to the transition line 60a through a third conductive plug 63 which penetrates at least one interlayer dielectric layer, and the transition line 60b is electrically connected to the second fanout line 42f through a fourth conductive plug 64 which penetrates the at least one buffer layer, the first gate insulating layer 46 and the second gate insulating layer 47.

Certainly, if the stability of the direct connection between the data line and the second fanout line through a via hole can be ensured, the data line can be directly connected to the second fanout line. As shown in FIG. 5C, the data line 50 and the second fanout line 42g are directly connected through the via hole. In some embodiments, the data line 50 is electrically connected to the first fanout line or the second fanout line through a fifth conductive plug 65. The fifth conductive plug 65 penetrates one or more insulating layers between the data line layer and the first fanout line or between the data line layer and the second fanout line layer.

It should be noted that, as shown in FIG. 1, the external integrated circuit is usually implemented by a separate circuit board 70, and there is a bending region 80 between the circuit board 70 and the fanout region 20. The bending of the bending region 80 allows the circuit board 70 to be folded back under the display region and the fanout region of the display panel, so that the circuit board 70 does not contribute to the frame width. The fanout region is used to provide a transition area for the connection between the display region and the external integrated circuit. Thus, in order to realize the signal transmission between the display region and the data lines of the external circuit, the fanout line of the fanout region 20 needs to be connected to the data line in the bending area 80 in addition to the data line of the display region 10. The fanout line in the fanout region 20 and the data line in the bending region 80 may be connected with each other in any manner as shown in FIGS. 5A to 5C.

FIGS. 5A, 5B and 5C show the connection between the data line and second fanout line formed by using the light shielding layer LS. FIGS. 6A and 6B show the connection between the first fanout line and the data line in the case where the first fanout line 41e and the first gate line are made of the same material and are disposed in the same layer and the first fanout line 41f and the second gate line are made of the same material and are arranged in the same layer. When specifically implementing the fanout line arrangement structure of the fanout region of the present disclosure, any one of the structures shown in FIGS. 5A to 5C and the structure of FIG. 6A or FIG. 6B may be used.

It should be noted that FIGS. 5A to 5C mainly show the line arrangement at the boundary between the display region 10 and the fanout region 20 (i.e., the part between the two vertical dashed lines in FIGS. 5A to 5C). After the data line and the fanout line are connected, in the main part of the fanout region, the orthographic projection of the first fanout line on the base substrate and the orthographic projection of the second fanout line on the base substrate may be overlapped partially or even overlapped completely, as shown in FIG. 2 and FIG. 4, which can be completely achieved through a patterning process.

It should also be noted that the layers structure shown in FIGS. 5A to 5C and FIGS. 6A and 6B includes the base substrate 40. Depending on the selection of the manufacturing process of the array substrate, the array substrate may further include a first buffer layer 44, a second buffer layer 45, a first gate insulating layer (GI) 46, a second gate insulating layer 47, a first interlayer dielectric layer (ILD) 43, and a second interlayer dielectric layer 48. For the two buffer layers, one of them is used to isolate the metal ions in the base substrate 40 made of glass to prevent the metal ions from diffusing into the TFT device, while the other one of them is used for heat preservation which would facilitate the formation of large crystalline grains of silicon (Si). For the two interlayer dielectric layers, one of them is made of $SiO_X$ for the purpose of planarization and insulation, while the other one of them is made of $SiN_X$ for the purpose of repairing Si defects. The first gate insulating layer 46 is used to insulate the first gate line layer (such as a metal layer) where the first gate line 12 is located, and the second gate insulating layer 47 is used to insulate the second gate line layer (such as a metal layer) where the second gate line 13 is located. It is appreciated that such a layers structure is only illustrated schematically, and does not mean that the present disclosure seeks to protect an array substrate only containing all of these layers. It is known that, if allowed, each layer in the layers structure may be increased or decreased. These deformations should also fall within the protection scope of the present disclosure.

Based on the descriptions of the foregoing embodiments, it should also be pointed out that the present disclosure aims to make the length of the display panel in the Y direction as small as possible by balancing the lines pitch and the capacitance between the lines, thereby achieving the goal of realizing a narrow frame. Any technical solution that can achieve this goal and has substantially the same principle should be considered to belong to the protection scope of the present disclosure.

It should be noted that in some of the foregoing embodiments, the data line is used as an example for description. However, it is known that the gate line also needs to transmit signals with the external IC circuit through the fanout line. Therefore, the connection between the gate line and the fanout line can be realized with reference to the foregoing embodiments relating to the connection between the data line and the fanout line, and details are not described herein again.

It should also be noted that in the foregoing embodiment, the array substrate including two types of gate lines (that is, the first gate line 12 and the second gate line 13) is used as an example for description. However, it is known that there is a kind of array substrate that only includes one type of gate line (that is, only the gate line for receiving the scanning signal). For this kind of array substrate, the principle mentioned above is also applicable, and details are not described herein again.

An embodiment of the present disclosure also provides a display device, which can reduce the width of the frame of the display panel to a certain extent. The display device includes any one embodiment or combination of embodiments of the array substrate as described above.

As can be seen from the above embodiments, in the display device provided by the present disclosure, the spacer layer is provided between the first fanout line layer and the second fanout line layer so as to increase the interval space therebetween. Thus, the capacitance formed between the first fanout line and the second fanout line further are reduced. Therefore, the problem of crosstalk is decreased and the power consumption is lowered. Meanwhile, the reduction in the capacitance formed between the first fanout line and the second fanout line also allow a certain overlap between the first fanout line and the second fanout line, thereby reducing the pitch of lines and decreasing the length of the fanout region in the Y direction which helps to narrow the frame.

It is noted that, the display device in the present embodiments may be any product or component with display function, such as electronic paper, mobile phones, tablet computers, TVs, laptops, digital photo frames, navigators and the like.

An embodiment of the present disclosure further provides a method of manufacturing an array substrate, which can reduce the width of the frame of the display panel to a certain extent.

Figure 7:
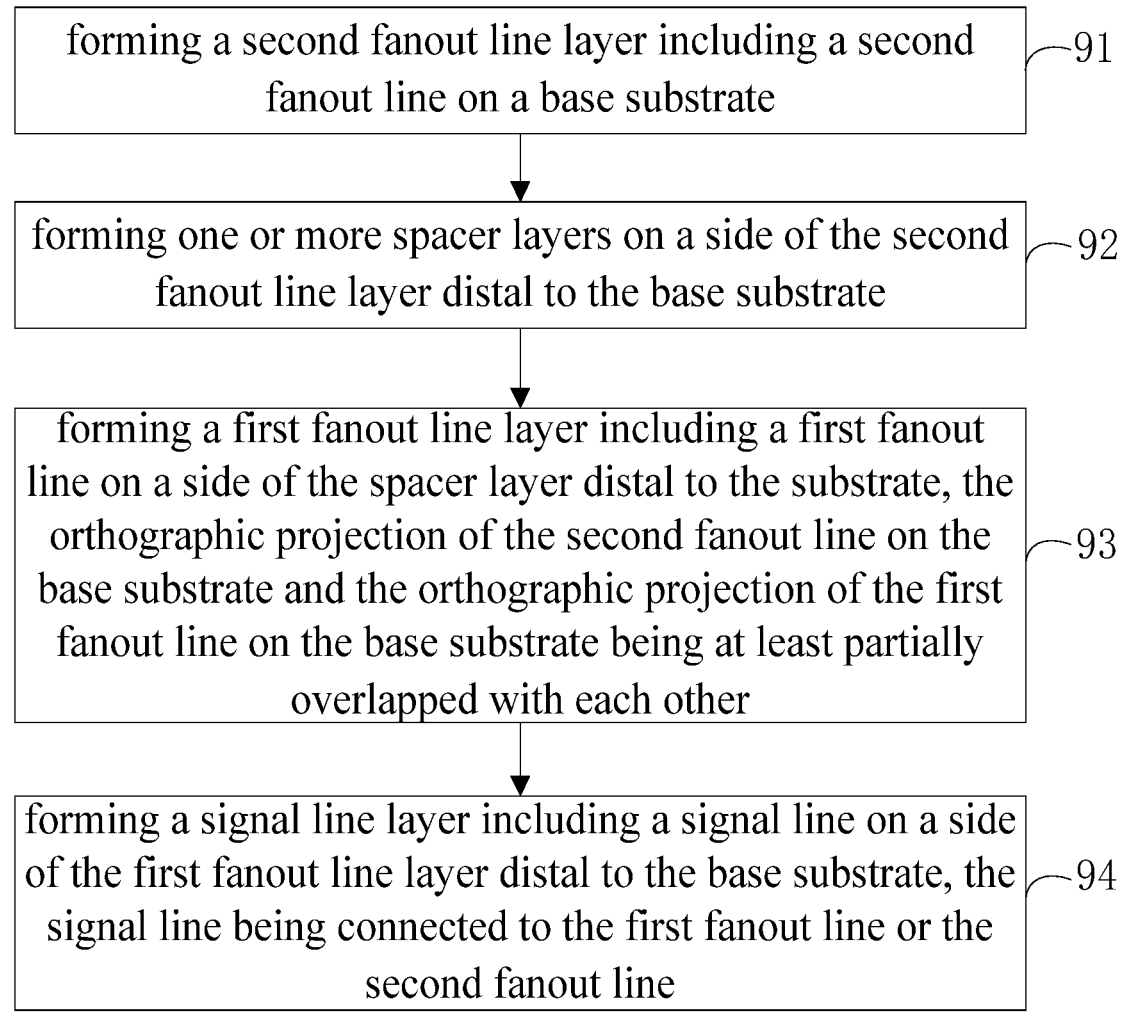
FIG. 7 schematically illustrates a flowchart of a method of manufacturing an array substrate according to some embodiments of the present disclosure.

As shown in FIG. 7, the manufacturing method of the array substrate includes:

Step 91: forming a second fanout line layer including a second fanout line on a base substrate;

Step 92: forming one or more spacer layers on a side of the second fanout line layer distal to the base substrate;

Step 93: forming a first fanout line layer including a first fanout line on a side of the spacer layer distal to the substrate, the orthographic projection of the second fanout line on the base substrate and the orthographic projection of the first fanout line on the base substrate being at least partially overlapped with each other;

Step 94: forming a signal line layer including a signal line on a side of the first fanout line layer distal to the base substrate, the signal line being connected to the first fanout line or the second fanout line.

The spacer layer is made of an insulating material; the signal line is formed in a display region of the array substrate; and the first fanout line and the second fanout line are formed in a fanout region of the array substrate.

As can be seen from the above embodiments, in the method of manufacturing the array substrate provided by the present disclosure, the spacer layer is provided between the first fanout line layer and the second fanout line layer so as to increase the interval space between the first fanout line layer and the second fanout line layer. Thus, the capacitance formed between the first fanout line and the second fanout line is further reduced. Therefore, the crosstalk is decreased and the power consumption is lowered. Meanwhile, the reduction in the capacitance formed between the first fanout line and the second fanout line also allows a certain overlap between the first fanout line and the second fanout line, thereby reducing the pitch of lines and decreasing the length of the fanout region in the Y direction which helps to narrow the frame.

In some embodiments, step 91 in the manufacturing method of the array substrate may further include the following steps:

forming a first metal thin film on the base substrate; and patterning the first metal thin film to form a light shielding layer and the second fanout line layer, wherein, the light shielding layer is used to shield the incident light into the array substrate from the base substrate, for example, to prevent the light from illuminating the active layer in a thin film transistor array of the array substrate.

Through fabricating one of the fanout line layers by the material of the light shielding layer, the layer structure between the one of the fanout line layers and the other one of the fanout line layers can be used as the spacer layer, so that the interlayer space can be increased (the light shielding layer is directly disposed on the substrate and thus belongs to the lowest layer structure) and the crosstalk may be further reduced. Meanwhile, the light shielding layer (metal material) existing in the fanout region can be fully utilized.

In some embodiments, the signal line further includes a gate line, and the manufacturing method of the array substrate may further include the following steps after the step 92:

forming a second metal thin film on the spacer layer; and patterning the second metal thin film to form a gate line layer in the display region and form a transition line layer at the boundary between the display region and the fanout region.

In this way, the gate line layer and the transition line layer can be formed at the same time through one patterning process, which simplifies the process and improves production efficiency.

In some embodiments, the gate line includes a first gate line 12 for forming a gate electrode of the TFT and a second gate line 13 for forming a storage capacitor in a display region of the array substrate. While making either the first gate line 12 or the second gate line 13, the transition line layer can be made simultaneously.

In some embodiments, the orthographic projection of the first fanout line and the orthographic projection of the second fanout line are overlapped with each other. Since the crosstalk is reduced, an overlap can be formed between the first fanout line and the second fanout line, which could reduce the pitch of lines and thus reduce the width of the lower frame.

In some embodiments, the spacer layer may include a buffer layer, or at least one gate insulating layer, or a combination of the buffer layer and at least one gate insulating layer. When the substrate is made of glass, the buffer layer can prevent the impurities in the base substrate from entering other layers, and the material of the buffer layer is not limited. The material of the buffer layer may include for example $SiN_X$ or $SiO_X$, although it is not limited thereto. The buffer layer is usually located near the base substrate. Therefore, when the second fanout line is located below the buffer layer and the first fanout line is located above the buffer layer, the interlayer space between the first fanout line and the second fanout line can be ensured to be large enough so that the capacitance between them can be reduced.

In the embodiment of the present disclosure, by adding at least one insulating layer between the first fanout line and the second fanout line, the interlayer space between the first fanout line and the second fanout line can be increased to further reduce the crosstalk issues.

It should be noted that the operations for forming the above layers include, but are not limited to (chemical phase, physical phase) deposition, and (magnetron) sputtering deposition. Those skilled in the art can understand that after forming each layer, corresponding patterns may be further formed thereon as required, which is not described in this disclosure any longer.

As can be seen from the above embodiments, in the array substrate and its manufacturing method and the display device provided by the present disclosure, the spacer layer is provided between the first fanout line layer and the second fanout line layer so as to increase the interval space therebetween. Thus, the capacitance formed between the first fanout line and the second fanout line further is reduced. Therefore, the crosstalk is decreased and the power consumption is lowered. Meanwhile, the reduction in the capacitance formed between the first fanout line and the second fanout line also allows a certain overlap between the first fanout line and the second fanout line, thereby reducing the pitch of lines and decreasing the length of the fanout region in the Y direction, which helps to narrow the frame.

The technical solution of the present disclosure has been described in detail above with reference to the accompanying drawings. In the prior art, the source/drain electrode and the active layer are in different layers, thus the array substrate has large thickness and the manufacturing process is complicated. In the technical solution of this application, the source electrode, drain electrode, data line, and active layer can be fabricated in the same layer by doping the copper nitride, thereby reducing the thickness of the array substrate and simplifying the fabricating process of the array substrate.

It is noted that, in the drawings, the dimensions of layers and areas may be exaggerated for clarity of the illustration. It is appreciated that when an element or layer is referred to as being "on" another element or layer, it may be directly on another element or layer, or an intermediate layer may be present therebetween. In addition, it is understood that when an element or layer is referred to as being "under" another element or layer, it may be directly under another element or layer, or at least one intermediate layer may be present therebetween. In addition, it is understood that when a layer or element is referred to as being "between" two layers or two elements, it may be the only one layer or element between two layers or two elements, or more than one intermediate layer or element may also be present therebetween. Like reference numerals refer to like elements throughout the description.

Those skilled in the art should understand that the foregoing descriptions are merely specific embodiments of the present disclosure and are not intended to limit the present disclosure, and any modifications, equivalent replacements, and improvements made within the spirit and principle of the present disclosure should fall within the protection scope of the present disclosure.

What is claimed is:

1. An array substrate, comprising:
   a base substrate; and
   a display region and a fanout region on the base substrate, wherein a signal line is provided in the display region; the fanout region comprises a first fanout line layer in which a first fanout line is provided, a second fanout line layer in which a second fanout line is provided, and one or more spacer layers between the first fanout line layer and the second fanout line layer; the signal line is connected to the first fanout line or the second fanout line; and the spacer layers are made of an insulating material;
   wherein an orthographic projection of the first fanout line on the base substrate and an orthographic projection of the second fanout line on the base substrate are at least partially overlapped with each other;
   wherein, the signal line comprises a data line; the array substrate further comprises a data line layer in which the data line is provided and a transition line layer between the data line layer and the first fanout line layer or between the data line layer and the second fanout line layer; the transition line layer comprises a transition line; and the data line is electrically connected to the transition line and the transition line is electrically connected to the first fanout line or the second fanout line.

2. The array substrate according to claim 1, wherein the signal line comprises a first signal line connected to the first fanout line and a second signal line connected to the second fanout line.

3. The array substrate according to claim 1, wherein the array substrate comprises a light shielding layer which is configured to shield incident light into the array substrate from the base substrate, and the second fanout line layer and the light shielding layer of the array substrate are made of same material and are in one same layer.

4. The array substrate according to claim 3, wherein the array substrate comprises at least one gate line layers, and the first fanout line layer and one of the at least one gate line layers are made of same material and are in one same layer.

5. The array substrate according to claim 1, wherein the signal line further comprises a gate line, and the transition line layer and the gate line are made of same material and are in one same layer.

6. The array substrate according to claim 1, wherein, the array substrate comprises a first gate line layer and a second gate line layer; the transition line layer and the first gate line layer are made of same material and are in one same layer;
   the fanout region comprises at least one buffer layer and a first gate insulating layer between the transition line layer and the second fanout line layer, and a second gate insulating layer and at least one interlayer dielectric layer between the data line layer and the transition line layer;
   the data line is electrically connected to the transition line through a first conductive plug which penetrates the second gate insulating layer and the at least one interlayer dielectric layer; and
   the transition line is electrically connected to the second fanout line through a second conductive plug which penetrates the at least one buffer layer and the first gate insulating layer.

7. The array substrate according to claim 1, wherein, the array substrate comprises a first gate line layer and a second gate line layer; the transition line layer and the second gate line layer are made of same material and are in one same layer;
   the fanout region comprises at least one buffer layer, a first gate insulating layer, and a second gate insulating layer between the transition line layer and the second fanout line layer, and at least one interlayer dielectric layer between the data line layer and the transition line layer;
   the data line is electrically connected to the transition line through a third conductive plug which penetrates the at least one interlayer dielectric layer; and
   the transition line is electrically connected to the second fanout line through a fourth conductive plug which penetrates the at least one buffer layer, the first gate insulating layer and the second gate insulating layer.

8. The array substrate according to claim 1, wherein the orthographic projection of the first fanout line on the base substrate and the orthographic projection of the second fanout line on the base substrate are fully overlapped with each other.

9. The array substrate according to claim 1, wherein the spacer layers comprise a buffer layer, or at least one gate insulating layer, or a combination of the buffer layer and the at least one gate insulating layer.

10. The array substrate according to claim 1, wherein a total thickness of the one or more spacer layers is greater than 500 nm.

11. The array substrate according to claim 1, wherein the first fanout line layer comprises a plurality of the first fanout lines, and the second fanout line layer comprises a plurality of the second fanout lines; and each of a pitch of the plurality of first fanout lines and a pitch of the plurality of second fanout lines is between 1.5 µm and 3.0 µm.

12. The array substrate according to claim 1, wherein a capacitance per unit area between the first fanout line and the second fanout line which are at least partially overlapped with each other is less than $8 \times 10^{-5}$ picofarad per square micrometer.

13. A display device comprising the array substrate according to claim 1.

14. A method of manufacturing an array substrate, comprising:
- forming a second fanout line layer comprising a second fanout line on a base substrate;
- forming one or more spacer layers on a side of the second fanout line layer distal to the base substrate;
- forming a first fanout line layer comprising a first fanout line on a side of the spacer layers distal to the base substrate, an orthographic projection of the first fanout line on the base substrate and an orthographic projection of the second fanout line on the base substrate being at least partially overlapped with each other;
- forming a signal line layer comprising a signal line on a side of the first fanout line layer distal to the base substrate, the signal line being connected to the first fanout line or the second fanout line;
- wherein, the spacer layers are made of an insulating material; the signal line is formed in a display region of the array substrate; and the first fanout line and the second fanout line are formed in a fanout region of the array substrate;
- wherein the signal line comprises a gate line, and after the step of forming one or more spacer layers on the side of the second fanout line layer distal to the base substrate, the method further comprises:
- forming a second metal thin film on the spacer layers;
- patterning the second metal thin film to form a gate line layer in the display region and form a transition line layer at a boundary between the display region and the fanout region.

15. The method according to claim 14, wherein the step of forming the second fanout line layer comprising the second fanout line on the base substrate further comprises:
- forming a first metal thin film on the base substrate; and
- patterning the first metal thin film to form a light shielding layer and the second fanout line layer, the light shielding layer shielding incident light into the array substrate from the base substrate.

16. The method according to claim 14, wherein the orthographic projection of the first fanout line on the base substrate and the orthographic projection of the second fanout line on the base substrate are fully overlapped with each other.

17. The method according to claim 14, wherein the spacer layers comprise: a buffer layer, or at least one gate insulating layer, or a combination of the buffer layer and the at least one gate insulating layer.

* * * * *